United States Patent [19]

Pennaz et al.

[11] Patent Number: 5,431,721
[45] Date of Patent: * Jul. 11, 1995

[54] INK VARNISH AND COMPOSITION AND METHOD OF MAKING THE SAME

[75] Inventors: Thomas J. Pennaz, Brooklyn Park; John H. Burban, Lauderdale, both of Minn.

[73] Assignee: Deluxe Corporation, St. Paul, Minn.

[*] Notice: The portion of the term of this patent subsequent to Jan. 17, 2012 has been disclaimed.

[21] Appl. No.: 210,049

[22] Filed: Mar. 17, 1994

Related U.S. Application Data

[63] Continuation-in-part of Ser. No. 120,175, Sep. 13, 1993, Pat. No. 5,382,282, which is a continuation-in-part of Ser. No. 92,392, Jul. 14, 1993, Pat. No. 5,338,351, which is a continuation-in-part of Ser. No. 946,762, Sep. 17, 1992, abandoned.

[51] Int. Cl.$^6$ ............... C09D 11/08; C09D 11/10
[52] U.S. Cl. ............... 106/20 R; 106/27 R; 106/29 R; 106/30 R
[58] Field of Search ............... 106/20 R, 30 R, 27 R, 106/29 R, 218, 219

[56] References Cited

U.S. PATENT DOCUMENTS

| | | | |
|---|---|---|---|
| 437,780 | 10/1890 | Higgins | 106/27 R |
| 1,070,713 | 8/1913 | Meckbach | 106/27 R |
| 1,822,533 | 9/1931 | Lasher | 106/31 R |
| 2,073,229 | 3/1937 | Shuey | 106/28 R |
| 2,139,092 | 12/1938 | Neidich | 106/27 R |
| 2,289,638 | 7/1942 | Erickson et al. | 106/30 R |
| 2,299,135 | 10/1942 | Erickson et al. | 106/30 R |
| 2,300,881 | 11/1942 | Erickson et al. | 106/30 R |
| 2,310,419 | 2/1943 | Ginn | 106/28 R |
| 2,313,328 | 3/1943 | Erickson et al. | 106/30 R |
| 2,327,594 | 8/1943 | Erickson et al. | 106/30 R |
| 2,327,596 | 8/1943 | Erickson et al. | 106/30 R |
| 2,346,968 | 4/1944 | Jeuck et al. | 106/30 R |
| 2,350,523 | 6/1944 | O'Neal | 106/27 R |
| 2,365,363 | 12/1944 | Swain | 106/27 R |
| 2,421,291 | 5/1947 | Schmutzler | 106/30 R |
| 2,427,921 | 9/1947 | Pfaelzer | 106/27 R |
| 2,436,954 | 3/1948 | Denton | 106/30 R |
| 2,461,918 | 2/1949 | Petke | 106/30 B |
| 2,597,903 | 5/1952 | Schmutzler | 106/30 R |
| 2,621,130 | 12/1952 | Cutler | 106/30 A |
| 2,653,142 | 9/1953 | Cody et al. | 106/30 R |
| 2,720,461 | 10/1955 | Voet | 106/30 B |
| 2,733,155 | 1/1956 | Williams et al. | 106/30 R |
| 2,762,712 | 9/1956 | Bloch et al. | 106/29 R |
| 3,261,787 | 7/1966 | Davies et al. | 106/20 R |
| 3,289,577 | 12/1966 | Uhlig | 106/2 |
| 3,342,764 | 9/1967 | Varron et al. | 106/27 A |
| 3,383,391 | 5/1968 | Carlick et al. | 106/27 R |
| 3,404,014 | 10/1968 | Drautz | 106/30 R |
| 3,409,449 | 11/1968 | Coney et al. | 106/30 R |
| 3,412,053 | 11/1968 | Pugliese | 106/27 R |
| 3,434,987 | 3/1969 | Dhein et al. | 106/252 |
| 3,471,415 | 10/1969 | Friedman et al. | 524/145 |
| 3,533,811 | 10/1970 | Clements et al. | 106/24 B |
| 3,597,376 | 8/1971 | Tashiro | 106/27 R |
| 3,615,752 | 10/1971 | Hoffman, Jr. et al. | 106/27 A |
| 3,652,469 | 3/1972 | Glaser et al. | 106/27 R |
| 3,660,329 | 5/1972 | Wysacki | 106/30 R |
| 3,775,381 | 11/1973 | Hayashi et al. | 106/30 R |
| 3,776,865 | 12/1973 | Glaser et al. | 106/27 R |
| 3,804,640 | 4/1974 | Buckwalter | 106/27 A |
| 3,844,994 | 10/1974 | Vijayendran | 106/20 R |
| 3,847,850 | 11/1974 | Rudolphy | 106/27 R |
| 3,850,648 | 11/1974 | Biedel et al. | 106/27 R |
| 3,874,850 | 11/1974 | Rudolphy | 436/50 |
| 3,890,156 | 6/1975 | Hiroharo et al. | 106/27 R |

(List continued on next page.)

*Primary Examiner*—Helene Klemanski
*Attorney, Agent, or Firm*—Dorsey & Whitney

[57] ABSTRACT

An ink composition, varnish and method in which the composition and varnish includes reduced levels of petroleum solvents, while retaining beneficial ink properties. The invention also relates to a method of making an ink composition and varnish including a cook cycle which minimizes or eliminates esterification and other reactions involving functional components of the composition and varnish.

40 Claims, No Drawings

U.S. PATENT DOCUMENTS

| | | | |
|---|---|---|---|
| 3,900,436 | 8/1975 | Drawert et al. | 106/27 R |
| 3,914,195 | 10/1975 | Asai et al. | 106/27 R |
| 3,937,674 | 2/1976 | Laarkamp | 106/28 R |
| 3,946,138 | 3/1976 | Jones | 106/27 R |
| 3,953,218 | 4/1976 | Pollard | 106/27 R |
| 3,981,730 | 9/1976 | Takahashi et al. | 106/27 R |
| 3,984,381 | 10/1976 | Tsuchiya et al. | 106/27 R |
| 4,026,794 | 5/1977 | Mauceri | 210/708 |
| 4,028,119 | 6/1977 | Yamada et al. | 106/27 R |
| 4,069,179 | 1/1978 | Jones | 106/27 R |
| 4,072,644 | 2/1978 | Hedrick | 524/528 |
| 4,077,807 | 3/1978 | Kramer et al. | 106/30 R |
| 4,079,026 | 3/1978 | Mone | 106/27 R |
| 4,079,102 | 3/1978 | Wagner et al. | 106/20 R |
| 4,087,483 | 5/1978 | Geerdes | 106/20 R |
| 4,137,083 | 1/1979 | Hedrick | 106/20 R |
| 4,155,886 | 5/1979 | DeGoler | 106/19 R |
| 4,163,001 | 7/1979 | Carumpalos et al. | 106/20 R |
| 4,183,833 | 1/1980 | Miyaguchi et al. | 106/27 R |
| 4,221,686 | 9/1980 | Sakiyama et al. | 106/27 R |
| 4,229,747 | 10/1980 | Hwang | 106/22 R |
| 4,252,701 | 2/1981 | Miyaguchi et al. | 106/27 R |
| 4,252,727 | 2/1981 | Yasui et al. | 106/20 R |
| 4,256,619 | 3/1981 | Miyaguchi et al. | 524/571 |
| 4,268,427 | 5/1981 | Miyaguchi et al. | 106/20 R |
| 4,301,049 | 11/1981 | Funatsu et al. | 106/20 R |
| 4,330,450 | 5/1982 | Lipowski | 524/547 |
| 4,339,367 | 7/1982 | Chino et al. | 106/27 R |
| 4,361,843 | 11/1982 | Cooke et al. | 106/27 R |
| 4,363,886 | 12/1982 | Lipowski et al. | 523/336 |
| 4,385,149 | 5/1983 | Tsuchiya et al. | 106/20 R |
| 4,386,961 | 6/1983 | Lin | 106/27 R |
| 4,388,434 | 6/1983 | Swift et al. | 524/476 |
| 4,391,640 | 7/1983 | Okoshi et al. | 106/30 R |
| 4,392,917 | 7/1983 | Lipowski et al. | 162/168.1 |
| 4,398,016 | 8/1983 | Homma et al. | 106/30 R |
| 4,400,215 | 8/1983 | Cooke et al. | 106/27 R |
| 4,419,132 | 12/1983 | Moynihan | 106/27 R |
| 4,484,948 | 11/1984 | Merritt et al. | 106/30 R |
| 4,505,828 | 3/1985 | Lipowski et al. | 252/8.554 |
| 4,508,868 | 4/1985 | Whyzmuzis et al. | 106/27 R |
| 4,514,540 | 4/1985 | Peck | 106/20 R |
| 4,519,841 | 5/1985 | Moynihan | 106/27 R |
| 4,528,036 | 7/1985 | Rudolphy | 106/30 C |
| 4,531,976 | 7/1985 | Lin | 106/27 R |
| 4,552,592 | 11/1985 | Rudolphy et al. | 106/30 C |
| 4,552,670 | 11/1985 | Lipowski | 507/120 |
| 4,554,019 | 11/1985 | Moynihan | 106/27 R |
| 4,574,057 | 3/1986 | Kaza et al. | 106/20 R |
| 4,579,888 | 4/1986 | Kodama et al. | 106/20 R |
| 4,589,920 | 5/1986 | Kanada et al. | 106/30 R |
| 4,595,518 | 6/1986 | Raynolds et al. | 252/8.6 |
| 4,612,051 | 9/1986 | Miller et al. | 106/30 R |
| 4,639,492 | 1/1987 | Makhlouf et al. | 525/54.42 |
| 4,648,905 | 3/1987 | Peck et al. | 106/29 R |
| 4,659,380 | 4/1987 | Winters et al. | 106/14.14 |
| 4,664,710 | 5/1987 | Gleason et al. | 106/23 D |
| 4,664,711 | 5/1987 | Kawaguchi et al. | 106/30 R |
| 4,693,846 | 9/1987 | Piccirilli et al. | 106/30 R |
| 4,699,660 | 10/1987 | Frank et al. | 106/20 R |
| 4,732,616 | 3/1988 | Kondo et al. | 106/20 R |
| 4,747,882 | 5/1988 | Schwartz et al. | 106/23 R |
| 4,758,276 | 7/1988 | Lin et al. | 106/27 R |
| 4,760,104 | 7/1988 | Miyaguma et al. | 106/27 R |
| 4,764,215 | 8/1988 | Rudolph | 106/27 R |
| 4,765,243 | 8/1988 | Schiefer et al. | 106/20 R |
| 4,783,220 | 11/1988 | Gamble et al. | 106/27 R |
| 4,789,399 | 12/1988 | Williams et al. | 106/20 R |
| 4,810,747 | 3/1989 | Bornack et al. | 524/538 |
| 4,822,419 | 4/1989 | Pepoy et al. | 106/20 R |
| 4,853,421 | 8/1989 | Hayes | 523/223 |
| 4,857,624 | 8/1989 | DeBlasi et al. | 106/30 R |
| 4,870,139 | 9/1989 | Kveglis et al. | 524/420.5 |
| 4,886,553 | 12/1989 | Gillich | 101/451 |
| 4,886,844 | 12/1989 | Hayes | 523/223 |
| 4,891,070 | 1/1990 | Dilling et al. | 106/26 R |
| 4,894,433 | 1/1990 | Bornack, Jr. et al. | 106/20 R |
| 4,904,303 | 2/1990 | Rudolphy et al. | 106/30 R |
| 4,938,801 | 7/1990 | Yoshioka et al. | 106/20 R |
| 4,942,111 | 7/1990 | Wade et al. | 430/273 |
| 4,943,430 | 7/1990 | Hefford et al. | 427/70 |
| 4,944,768 | 7/1990 | Balliello et al. | 8/52 A |
| 4,960,464 | 10/1990 | Chen | 106/27 R |
| 4,963,188 | 10/1990 | Parker | 106/20 R |
| 4,966,628 | 10/1990 | Amon et al. | 106/20 R |
| 4,982,661 | 1/1991 | Zweig | 101/451 |
| 4,990,185 | 2/1991 | Krishnan | 106/20 R |
| 5,004,763 | 4/1991 | Imogawa | 523/161 |
| 5,009,716 | 4/1991 | Gerson | 134/40 |
| 5,015,711 | 5/1991 | Simonet et al. | 526/301 |
| 5,017,228 | 5/1991 | Goda | 106/20 R |
| 5,021,538 | 6/1991 | Crews | 528/129 |
| 5,026,755 | 6/1991 | Kveglis et al. | 106/20 R |
| 5,030,683 | 7/1991 | Nakamura | 524/512 |
| 5,041,161 | 8/1991 | Cooke et al. | 106/27 R |
| 5,066,331 | 11/1991 | Hutter | 106/20 R |
| 5,074,915 | 12/1991 | Yoshioka et al. | 106/30 R |

(List continued on next page.)

U.S. PATENT DOCUMENTS

| | | | |
|---|---|---|---|
| 5,077,348 | 12/1991 | Nakamura et al. | 524/512 |
| 5,084,333 | 1/1992 | Beach et al. | 428/272 |
| 5,087,659 | 2/1992 | Fujisawa | 524/594 |
| 5,098,478 | 3/1992 | Krishnan et al. | 106/20 R |
| 5,100,718 | 3/1992 | Weintraub | 428/195 |
| 5,100,934 | 3/1992 | Glesias | 106/20 R |
| 5,101,010 | 3/1992 | Dickens et al. | 106/20 R |
| 5,102,856 | 4/1992 | Doll et al. | 503/209 |
| 5,104,449 | 4/1992 | Pavlin | 107/30 R |
| 5,104,567 | 4/1992 | Staehr | 252/174.17 |
| 5,106,416 | 4/1992 | Moffatt et al. | 106/30 R |
| 5,109,054 | 4/1992 | Smith | 524/514 |
| 5,114,478 | 5/1992 | Auslander et al. | 106/30 R |
| 5,116,409 | 5/1992 | Moffatt | 106/20 R |
| 5,118,583 | 6/1992 | Kondo et al. | 101/451 |
| 5,127,948 | 7/1992 | Shepherd | 106/30 R |
| 5,166,245 | 11/1992 | Zuraw | 524/270 |
| 5,173,113 | 12/1992 | Sugerman et al. | 106/27 R |
| 5,178,672 | 1/1993 | Miller | 106/28 R |
| 5,189,090 | 2/1993 | Hutter et al. | 106/30 R |
| 5,198,024 | 3/1993 | Tuovinen et al. | 106/28 R |
| 5,216,071 | 6/1993 | Hutter et al. | 106/30 R |
| 5,234,577 | 8/1993 | Van Slyke | 134/27 |
| 5,264,481 | 11/1993 | Hutter et al. | 106/30 R |

INK VARNISH AND COMPOSITION AND METHOD OF MAKING THE SAME

This is a continuation-in-part of application Ser. No. 08/120,175 filed Sep. 13, 1993, now U.S. Pat. No. 5,382,282, which is a continuation-in-part of application Ser. No. 08/092,392 filed Jul. 14, 1993, now U.S. Pat. No. 5,338,351, which is a continuation-in-part of Ser. No. 07/946,762 filed Sep. 17, 1992, now abandoned.

BACKGROUND OF THE INVENTION

1. Field of the Invention

The present invention relates to the field of ink compositions and varnishes and more particularly to ink varnishes and methods useful in the manufacture of ink compositions which exhibit desirable ink properties while at the same time substantially reducing or eliminating use of petroleum solvents. The present invention also relates to ink varnishes having functional components providing the varnishes and resulting ink compositions with desirable properties including ink set, life, gloss, water washability and pigment dispersion, among others, and to methods of making such ink varnishes including an improved varnish cook cycle which maintains such functional components substantially in their functional form during the cook cycle.

2. Description of the Prior Art

A wide variety of printing processes currently exist in the art. Although the ink composition varnish and method of the present invention have applicability to most if not all of these prior processes, it has particular applicability to a lithographic printing process commonly referred to as offset lithography.

Traditional ink compositions are comprised of an ink varnish and a dispersed pigment. Ink varnishes in turn include a resin component comprised of a hard resin, a liquid resin or a combination of hard and liquid resins, an oil component and a solvent component. The oil and solvent components are comprised of materials such as vegetable oils, vegetable oil derivatives or combinations thereof, petroleum distillates and a variety of replacement solvents. Various ink properties such as ink set, life, gloss, tack, viscosity and color development depend upon the ink varnish components and in particular the selection of the resin, oil and solvent components. Solvents in printing inks perform several functions. First, they provide solvency during the varnish manufacturing step by dissolving and carrying the various resins. Second, they are used during final adjustment of the ink varnish and composition to achieve the desired ink tack and viscosity. Third, solvents provide the primary means to set the ink while also controlling, to a major extent, the ink life. As used in the printing industry, the "set" of an ink reflects the time needed for a printed ink to set up via evaporation, reaction, absorption or the like to a point where it can handled without smearing of the ink. The "life" of an ink reflects the time during which the ink can remain on a print plate or other application equipment without setting or drying. Generally, the properties of ink set and ink life are balanced. For example, conventional inks which set quickly tend to have a short life on the press, while inks which have a long life on the press generally take longer to set, especially on coated papers or other less porous substrates.

The degree of solution among the traditional ink varnish components also significantly affects various ink properties. In general, as the degree of varnish resin solubility increases, ink stability and gloss increase while viscosity decreases. Because cooking of the varnish generally improved solubility of the conventional varnish components, conventional varnish cook cycles have favored long cook times at elevated temperatures. For example, conventional cook cycles involve cook temperatures as much as 100° F. (38° C.) or more above the melting point of the hard resins and cook times as long as ten hours or more.

Various attempts have been made to improve and optimize the various ink properties by developing new ink resins, by using different solvents and oils and by varying the ratios and using different combinations of resin, oils and solvents. The solvents of choice in traditional ink varnish formulation have included petroleum distillates because of their ability to readily dissolve the conventional ink resins, because of their high volatility and because of their relatively low molecular weight. The high volatility causes the solvents to evaporate quickly from the printed ink while the low molecular weight enables the petroleum distillates to readily absorb into the substrate immediately after printing. Such evaporation and absorption causes the viscosity of the ink film to increase rapidly, thereby causing the ink to set.

Thus, traditional ink varnishes have included petroleum distillates as solvents and have required cooking the varnish at elevated temperatures and for extended periods of time to improve resin solubility and thus stability. However, there are two principal disadvantages of using petroleum distillates and other petroleum based solvents. First, because of their high volatility, petroleum distillates emit volatile organic compounds (VOCs) both during printing and cleanup as well as during the setting and drying. Thus, significant restrictions have been imposed on their use by Occupational Safety and Health Agency (OSHA), Environmental Protection Agency (EPA) and other regulations. Secondly, petroleum distillates are essentially a nonrenewable resource.

Because of the desire to reduce the use of petroleum based solvents in ink compositions, ink compositions and varnishes have been developed in which all or a portion of the petroleum based solvents have been replaced with nonvolatile organic solvents. For example, in U.S. Pat. No. 5,173,113 issued to Sugarman, the petroleum solvents have been replaced by various unsaturated fatty acid esters. Further, in U.S. Pat. No. 4,938,801 issued to Yoshioka, a portion of the petroleum solvent has been replaced by a nonvolatile polar solvent which is then denatured. Attempts have also been made to substitute vegetable oils such as linseed oil, soy oil, canola oil or tung oil in printing inks in place of the petroleum distillates, however, the use of such vegetable oils has been found to be particularly restrictive because of the limited compatibility and solubility of most hard resins in such oils and the longer set times of inks made with these oils. Still further, as disclosed in U.S. Pat. No. 5,178,672 issued to Miller, various fatty acids and fatty acids esterified with a simple alcohol or glycol have been used.

Although the replacement of petroleum solvents with nonvolatile or less volatile solvents has achieved the primary objective of reducing dependence on petroleum based solvents, many of the ink properties, most notably ink set, formulation latitude and gloss, have suffered. Further, although the solvent formulation has changed, the methods of manufacturing the ink varnishes, and in particular the varnish cook cycles, have not changed significantly. For example, current ink varnish manufacturing technology, including technology relating to varnishes having a significant nonvolatile solvent component or other functional component, continues to involve cooking the varnish components at elevated temperatures well above the melting point of the hard resins and for an extended period of time in an effort to improve the solubility of the various varnish components and thus the varnish stability. However, as discussed below, such cook cycles result in esterifying reactions among the various varnish components and in particular the solvent replacements and/or the other functional components. These reactions result in the loss of many of the possible additional benefits of utilizing the nonvolatile solvents and various other functional varnish components.

Accordingly, there is a need in the art for an ink composition or varnish, and a method of making the same, in which the use of petroleum solvents has been significantly reduced or eliminated, but which continues to have highly acceptable stability, highly acceptable ink properties including ink set, life, gloss, tack, viscosity and pigment dispersion and which retains additional benefits of the nonvolatile replacement solvents. A need also exists for a method of making an ink composition or varnish including a cook cycle having a primary objective of dissolving the varnish components, while also limiting reactions among functional components, thereby retaining the beneficial functional properties of such components in the finished varnish.

SUMMARY OF THE INVENTION

In contrast to the prior art, the present invention provides an ink composition or varnish in which petroleum based solvents have been substantially reduced or eliminated and/or which contain functional components providing such composition and varnish with desirable ink properties such as ink set, life, gloss, tack, viscosity, pigment dispersion and water washability, among others. The present invention also provides an improved ink manufacturing method or cook cycle which retains the beneficial properties of the nonvolatile solvents which have been selected to replace the petroleum solvents as well as the beneficial properties of other functional varnish components such as those providing water washability and/or pigment dispersibility. Such improved cook cycle also substantially reduces energy requirements and ink varnish manufacturing time. The present invention has particular applicability to ink compositions and varnishes which are substantially water insoluble in their printed form and which are usable in offset lithography. However, ink compositions and varnishes usable in other printing processes are also within the scope of the present invention.

In accordance with the present invention, it has been discovered that although ink varnish cook cycles at elevated temperatures for extended periods of time are highly desirable when using petroleum based solvents, such cook temperatures and times are detrimental to many of the potential benefits of functional varnish components such as fatty acids, fatty acid esters and other relatively low molecular weight nonvolatile replacement solvents, water reducible resins to provide water washability, and acid functional resins to provide improved pigment dispersion, among others.

Accordingly one aspect and object of the present invention is to provide an ink varnish cook cycle which involves a lower temperature and a significantly shorter cook time than conventional ink varnish cook cycles. Many benefits of the replacement solvents and other functional components which are lost when conventional cooking techniques are employed are retained with the cook cycle of the present invention. This results in ink properties, and in particular ink set, life and gloss properties which are, in many cases, as good as or better than ink compositions containing petroleum solvents. Such cook cycle also retains the beneficial properties of functional components such as water reducible resins, thereby facilitating the manufacture of water washable ink compositions and varnishes.

Another object of the present invention is to provide a varnish cook cycle for ink varnishes containing functional or reactive components in which the cook time and cook temperature are sufficiently long and high to dissolve or solvate the various varnish components, but sufficiently short and low to minimize reactions among the components, and thus retain the beneficial properties of such functional components.

A further object of the present invention is to provide an ink varnish cook cycle for an acid functional system in which the reduction in acid number of the ink varnish during the cook cycle is no greater than about 25% and/or in which the acid number of the ink varnish is reduced to no lower than about 25 during the cook cycle.

A further object of the present invention to provide a water insoluble ink composition or varnish having an absence or a minimal amount of petroleum based solvents and an acid number no less than about 25, preferably no less than about 45 and most preferably no less than about 60.

A further aspect of the present invention includes the use of various fatty acids, fatty acid esters and other low molecular weight nonvolatile solvents in combination with various functional resins including one or more water reducible resins to provide a substantially water insoluble ink composition which can be printed in its water insoluble form and washed up using aqueous based solutions.

These and other objects of the present invention will become apparent with reference to the description of the preferred embodiment and method and the appended claims.

DESCRIPTION OF THE PREFERRED EMBODIMENT AND METHOD

The ink varnishes, compositions and method of the present invention have particular applicability to lithographic ink varnishes and compositions useful in the field of offset lithography. Accordingly, the preferred embodiment and method will relate principally to lithographic varnishes and compositions and ink properties important to offset lithography. The present invention is equally applicable, however, to other ink varnishes and compositions and other print processes including letter-press, gravure, flexographic and intaglio, among others.

In accordance with the present invention, it has been unexpectedly discovered that fatty acids, fatty acid esters and other relatively low molecular weight nonvolatile solvents behave in a manner similar to that of petroleum solvents with many of the same benefits of petroleum solvents, as long as they remain substantially in their low molecular weight form and are not combined with other components of the varnish through esterification, transesterification or other reactions. In other words, it has been found that certain fatty acids, fatty acid esters and other low molecular weight nonvolatile solvents useful in the present invention are relatively mobile and reactive and that if they can be retained in their low molecular weight form, they essentially mimic the behavior of petroleum solvents by being readily absorbed into the printed substrate. Further, because such solvents in their low molecular weight form are hydrophilic, they are, in many cases, more readily absorbed, thus resulting in set times comparable to those achieved through the use of petroleum solvents.

It has also been discovered that various other functional components of an ink varnish can provide highly desirable ink properties such as water washability or pigment dispersion as long as such functional components are retained in their functional form during the cook cycle and are not subjected to esterification, transesterification or other reactions. As used herein, the term "functional component" of a varnish means a varnish component having one or more of a variety of desired functional properties such as, among others, mobility, hydrophilicity, water reducibility, pigment dispersibility and resin solubility. Such functionality is often exhibited in a functional component because of the presence of various functional groups such as ester linkages, carboxyl or acid groups (COOH), hydroxyl groups (OH) or amine groups (NH$_3$). The preferred embodiment and method, however, will be described with respect to an acid functional system.

Maintenance of nonvolatile solvents in their low molecular weight and unreacted form and maintenance of other functional components in their unreacted form, however, runs contrary to the prevailing ink varnish manufacturing technology which is to cook the varnish components at elevated temperatures and for extended periods of time. This has always been considered necessary to insure full solvation of the resins in the solvents and oils to thereby stabilize the varnish. This was particularly the case when petroleum solvents were used and when substitute nonvolatile solvents were used in combination with conventional ink resins having relatively low acid functionality. The limited solubility between many of these low molecular weight nonvolatile solvents and such resins reinforced the notion that long cook times at elevated temperatures was critical.

The present inventors recognized, however, that high cook temperatures and extended cook times were incompatible with the maintenance of most nonvolatile solvents or other functional varnish components in their unreacted form. At least two reasons existed for this. First, the low molecular weight nonvolatile solvents as well as other functional varnish components tended to be highly reactive due to their mobility, functionality and/or lack of steric hindrance and thus subject to esterification, transesterification or other condensation reactions. Second, such reactions tended to be highly temperature dependent, with a tendency to proceed rapidly at temperatures exceeding about 200° F. (93° C.) and extremely rapidly at temperatures exceeding 300° F. (149° C.). Esterification reactions are well known and involve the reaction of carboxyl groups and hydroxyl groups present on the resins, oils and solvents to form an ester linkage and thus join smaller molecules together into larger molecules. Transesterification reactions involve the attack of existing ester linkages by carboxyl or hydroxyl functional materials. In acid functional systems, the acid group cleaves the existing ester bond and is reattached to the resin by formation of a new ester group. The potential for both esterification and transesterification reactions to occur increases rapidly as the acid number of the varnish and its components is increased. As a result, esterification and other reactions involving the low molecular weight nonvolatile solvents or other functional components occur readily during conventional cook cycles, thus diminishing many of the benefits of such components.

In an acid functional system, esterification and other reactions during a varnish cook cycle can be followed by monitoring the acid number, viscosity and tack of the varnish as it cooks. The acid number of a particular material is one accepted measure of acid functionality or the number of free acid or carboxyl groups (COOH) groups available in that material for reaction. Tests are known in the art for determining the acid number of a material. Acid number is expressed as the amount of potassium hydroxide (KOH) in milligrams (mg) required to neutralize one gram of the material tested. Since the esterification reaction consumes acid, the acid number of the varnish decreases as the cook cycle, and thus esterification, proceeds. The reduction of the acid number of the varnish during the cook cycle can be determined by comparing the acid number at the beginning and at the end of the cook cycle. The acid number at the beginning can be determined by calculation (the theoretical acid number) or by measurement. The beginning of the cook cycle is the point at which all of the resin is dissolved in the solvent and oil. The acid number at the end of the cook cycle is determined by measurement.

Traditional varnish cook cycles reduce the acid number of the varnish by as much as 50 to 70% or more to a value of less than 20 and often less than 10. Such cook cycles are considered necessary to reduce the ionic behavior of the varnish and thereby increase the overall stability and water insolubility of the ink. In contrast, the process of the present invention involves a cook cycle which results in a minimum reduction of the acid number of the varnish, preferably by less than 25%, more preferably less than 10% and most preferably less than 5%. Accordingly, the resulting loss or reduction of acid number during the cook cycle provides a quantitative method by which esterification and other reactions can be monitored and thus use of the present invention determined. In addition, because esterification and transesterification reactions can also cause changes in viscosity and tack of the varnish as it cooks, the extent to which such reactions occur can often be determined by monitoring the viscosity and/or tack.

In other functional systems such as hydroxy or amine functional systems, the extent of reaction by the hydroxy or amine functional components during a cook cycle can be followed by monitoring the respective hydroxy or amine number of the varnish while it cooks.

The ink varnishes in accordance with the present invention and to which the method of the present invention is applicable are those which are substantially water insoluble and intended to be printed in their water insoluble form. Further, the ink varnishes of the present invention are oleoresinous varnishes which are generally used to produce quick set, heat set and various other drying inks which set and/or dry by oxidation, absorption into the substrate, and/or solvent evaporation. In an oleoresinous system, the ink varnish is comprised principally of resins, oils and solvents. A general requirement of the resin, oil and solvent components is that they be compatible with one another. In other words, capable of solvation or miscibility.

The resin component of the ink varnish of the present invention functions among other things as a film former to bind the varnish and pigment together and, when the ink drys, to bind the same to the receiving substrate. The resin component also contributes to the properties of hardness, gloss, adhesion and flexibility of the ink. In conventional oleoresinous systems, the resin component is commonly comprised of a hard resin component and/or a liquid resin component, but can comprise various other compositions and resins as well. Preferably the ink varnish of the present invention also comprises both a hard resin and a liquid resin; thus, it is at least a two resin component system. However, this is not a requirement.

For a two resin component system in accordance with the preferred composition, the hard resins are normally solid at room temperatures and typically fall into two principal classes: the modified rosin ester resins and the modified hydrocarbon resins. Various hard resins or hard resin combinations or blends can be, and have been, utilized in the ink varnish of the present invention provided such resins are compatible with the other components of the varnish. As used herein, compatibility means generally soluble or miscible with one another. Hard resins usable in the ink varnishes of the present invention may be comprised of natural or processed resins such as rosins, rosin esters, maleic modified resins, rosin modified fumaric resins, dimerized and polymerized rosins, asphalts such as gilsonite and like, phenolics, rosin modified phenolics, terpenes, polyamides, cyclized rubber, acrylics, hydrocarbons and modified hydrocarbons. Also included among the available hard resins are those identified in The Printing Ink Manual, 4th Ed. (1988) edited by R. H. Leach and published by Van Nostrand Reinhold, the substance of which is incorporated herein by reference.

Conventional hard resins usable in ink varnishes are usually cooked so as to have substantially all of the acid or carboxyl groups (COOH) reacted with all or substantially all of the hydroxyl (OH) groups. This results in a resin having relatively low acid functionality and thus low reactivity with an acid number less than 30 and often less than 20. Although these low acid functional resins can be used in the present invention, improved compatibility and solubility with the oils, nonvolatile solvents and other functional varnish components of the present invention can be achieved by using hard resins with elevated acid functionality, and in particular those exhibiting acid numbers greater than 30, more preferably greater than 40, and most preferably greater than 50. The hard resins generally have melting temperatures greater than about 300° F. (149° C.).

The liquid resin component for a two resin component ink varnish of the present invention, like the hard resins, functions to form the varnish or ink composition into a cohesive material and, upon printing, to bond the pigment to the receiving substrate. However, unlike the hard resins described above the liquid resin component is typically not solid, but is a viscous liquid. Liquid resins usable in accordance with the present invention can include alkyds, polyesters, maleic modified drying oils and styrenated epoxy esters together with various other liquid resins known to those in the art and also those identified in The Printing Ink Manual, supra, the substance of which is incorporated herein by reference. The liquid resins may also include, if desired, functional resins such as water reducible resins for providing the ink with water washability as disclosed in pending U.S. patent application Ser. No. 08/092,392 filed Jul. 14, 1993. The substance of the entirety of such pending application and particularly the disclosure and examples relating to the water reducible liquid resins is incorporated herein by reference.

As used herein, the term water reducible defines a property of a resin or composition which enables such resin or composition to be substantially water insoluble under certain conditions (preferably pH related) and capable of being or becoming water soluble or water washable or dispersible under certain other conditions (preferably pH related). In accordance with the preferred embodiment, the term water reducible defines a resin or composition whose water solubility behavior is pH dependent, with such resin or composition being water insoluble under certain acidic conditions and water washable under certain alkaline conditions, or vice versa. The term water washable as used herein refers to a substantially water insoluble ink composition or varnish which can be printed in its water insoluble form, but cleaned up or washed with an aqueous solution.

Numerous water reducible resins currently exist or can be formulated to meet the requirements of the present invention. Many of these have been tested in lithographic or other printing environments. Specifically, it has been shown that certain water reducible alkyds (Cargill's short oil alkyds 74-7450, 74-7451; Cargill's long oil alkyd 74-716; Cook Composite's short oil alkyd 101210), certain water reducible polyesters (Cargill's polyester 72-7203), certain water reducible polyolefins (Cargill's modified polyolefin 73-7358), certain water reducible modified oils (Cargill's modified linseed oil 73-7319) and certain water reducible epoxy esters (Cook Composite's styrenated epoxy ester 100453) exhibit the desired characteristics and are acceptable provided they are compatible with the other components of the system and are present in an amount sufficient to cause the varnish and ink composition to exhibit similar characteristics. The most preferred resins are the water reducible alkyds and water reducible polyesters. All of the above are compatible with castor oil except for Cargill's modified linseed oil 73-7319 which is compatible with linseed and soya oil and Magie solvent. Cargill's short oil alkyd 74-7451 is additionally compatible with linseed and castor oils.

For the water reducible resins and for the ink compositions or varnishes incorporating such resins as described above, water solubility or washability characteristics depend on the pH of the aqueous solution with which such compositions come into contact. Using the preferred water reducible resins of the present invention, such resin and the resulting compositions or varnishes are water insoluble at a first acidic pH level less than 7.0. Preferably the pH of the solution to which the composition will come into contact in its insoluble form is between about 3.0 and 6.5 and most preferably between about 4.0 and 5.5. The second pH level at which the water reducible resin and resulting ink composition or varnish becomes water soluble or washable is an alkaline pH having sufficient basic strength to substantially neutralize the acid groups of the water reducible resin. Preferably such pH is between about 8.5 and 14 and most preferably between about 10.5 and 13. Preferably, the water reducible resin should comprise at least about 5% by weight of the varnish, more preferably about 5% to 60% by weight and most preferably about 10% to 40% by weight.

The water reducible resins of the type described above are acid functional, with such acid functionality being a principle factor in providing such resins with their water reducible properties. Acid numbers of these resins are generally above 25 and preferably above 30. Because of this functionality, employment of conventional cook cycles will tend to result in esterification and other reactions, thus diminishing or eliminating the desired water reducible properties. Accordingly, the cook cycle of the present invention employs cook times and cook temperatures which minimize or eliminate esterification and other reactions involving the water reducible resin components. The benefits of water washability can be achieved by using water reducible resins along with other conventional varnish components. Preferably, however, a water washable ink varnish in accordance with the present invention includes both water reducible resins for water washability and low molecular weight nonvolatile solvents such as those described below for improved ink set, life and other properties.

The oil and solvent portion of the ink varnish of the present invention can be comprised of various oils and solvents common in ink formulation including, among others, various vegetable oils such as linseed oil, soya oil, castor oil and tung oil, various vegetable oil derivatives and various relatively low molecular weight nonvolatile solvents such as fatty acids and fatty acid esters. The solvent portion of the ink varnish may also include a limited amount of petroleum based solvents if desired, however, preferably, the use of petroleum based solvents is eliminated entirely or reduced as much as possible for the reasons discussed above. Preferably, the low molecular weight nonvolatile solvents should comprise between about 5% to 75% by weight of the ink varnish, more preferably about 10% to 40% by weight and most preferably about 15% to 30% by weight.

The low molecular weight nonvolatile solvents useful in the composition of the present invention assume a nonvolatile or substantially nonvolatile state at ambient temperatures. As used herein, the term nonvolatile is intended to mean liquids which do not evaporate appreciably under ambient conditions or have a vapor pressure less than 1.0 mmHg at 25° C. Examples include solvent groups which bring about acid base reaction or hydrogen bonding such as carboxyl group, amino group, hydroxyl group, ether group and amide group. Also included are the fatty acids of $C_5$ or above and their fatty acid esters, liquid aliphatic amines such as aliphatic monoamine, ethylene diamine, propylene diamine and alkyl derivatives thereof; polyalcohol such as aliphatic alcohol of $C_5$ or above, ethylene glycol, diethylene glycol, propylene glycol, alcohol ether thereof, aliphatic ether, glycerine, trimethylolpropane and pentaerythritol; and other solvents including ketone such as cyclohexanone, ester and amine.

In accordance with the present invention, the low molecular weight nonvolatile solvents include those solvents having a molecular weight less than about 500 and more preferably less than 350. These solvents are sufficiently mobile and sufficiently hydrophilic so that they will be quickly absorbed into the printed substrate provided they are not subject to esterification, transesterification or other reactions during the varnish cook cycle. Many of the nonvolatile solvents such as the fatty acids have a relatively high acid functionality, with acid numbers greater than about 190. Thus, they are subject to both esterification and transesterification reactions. Others such as esters, however, have little or no acid functionality. Thus, these are subject principally to transesterification reactions.

In accordance with the present invention, the preferred components of the ink varnish are those considered to have a relatively high acid functionality as described above. The use of high acid functional materials such as certain resins and the like are increasing in ink formulation, particularly as more functional nonvolatile solvents are being used. Several potential advantages can be realized from such components including improved pigment dispersion, emulsification control and improved solubility between the acid functional resins and the acid functional solvents, among others. Further, water washability properties can be provided in an ink by using acid functional, water reducible resins. Many of these potential advantages and properties are lost or significantly diminished, however, during conventional cook cycles as esterification and other reactions occur.

The cook cycle in accordance with the present invention involves cooking the various varnish components at temperatures and for a time period which is sufficient to dissolve the resins into the oils and solvents, but not at temperatures or times which will result in any appreciable esterification or transesterification, thereby maintaining the various functional components substantially in their functional form. Accordingly, the cook cycle of the present invention includes cooking the varnish components in a cook reactor or other vessel at a temperature slightly above the melting point of the highest melting point hard resin. The melting point of the highest melting point resin will vary from varnish to varnish. Preferably, however, the cook temperature should be no more than about 50° F. (28° C.) higher than the highest melting point resin, preferably no more than 20° F. (11° C.) and most preferably no more than about 10° F. (6° C.). The materials are then held at or about this temperature with agitation for a time period which is preferably less than one hour, more preferably less than 30 minutes and most preferably for a period of about 5–20 minutes. The cook conditions, specifically temperature and time, should be sufficiently high and long to melt the resins and to dissolve the various varnish components but sufficiently low and short to limit esterification or other reactions as much as possible, thereby maintaining the nonvolatile solvents and other functional components substantially in their unreacted and functional form.

To accomplish the above objectives, it may also be desireable to stage the resin addition by adding resins to the reactor as the melting point of that particular resin is reached. This allows resins to melt in stages, thereby avoiding longer holding times at higher temperatures since lower melting resins will have already been dissolved. Further, it is highly desireable to utilize high shear mixing to break up larger pieces of resin to dissolve particles as rapidly as possible. Preferably the cook temperature and cook time should be low and short enough to limit the reduction of acid number during the cook cycle to no more than 25%, preferably no more than 10% and most preferably no more than about 5%. Further, with such cook cycle, the resulting ink varnish for a water insoluble ink composition of the present invention preferably exhibits an acid number greater than 60, more preferably greater than 45 and most preferably greater than 25.

At the conclusion of the cooking step, the temperature of the components in the reactor is preferably cooled quickly so that if the temperature of such components is greater than about 300° F. (149° C.), such temperature drops below this level within about 5 minutes. This may be accomplished either by appropriate heat exchanger or cooling means or by holding back a portion of the liquid components of the varnish (preferably oils and/or solvents) and leaving them at room temperature. Then, at the end of the cook cycle, these ingredients are combined with the heated components for purposes of quickly cooling such heated components. About 5% to 30% by weight of the oils and solvents and preferably about 10% to 20% of the oils and solvents may be withheld from the cook cycle for this purpose.

The specific cook temperatures, cook times, cool times and techniques can vary, and will in fact vary, depending upon the particular components of the system. The temperature and duration of the cook cycle, however, should be sufficiently low and sufficiently short so as to minimize or eliminate esterification or other reactions among the varnish components. Preferably, in varnishes having low molecular weight nonvolatile solvents, at least about 70% of such solvents will remain in their low molecular weight form during the cook cycle.

Following preparation of the ink varnish as described above, an ink composition is made by combining the ink varnish with the desired pigment and dispersing the pigment throughout the varnish. Technologies and methods for pigment dispersion are well known to those knowledgeable in the art and any of these methods can be used in preparing the ink composition in accordance with the present invention. One accepted method of dispersing color pigment in ink varnish which is applicable to varnishes of the present invention is a process known as flushing. To practice this process a pigment-/water slurry composed of about 30% pigment and 70% water and commonly referred to as press-cake is mixed with the varnish with sufficient energy to cause the varnish to replace the water. The displaced water is then decanted off, leaving the pigment dispersed in the varnish. The resulting product is referred to in the art as a color flush containing a high concentration of pigment. The ink composition is then produced by combining the flush with a letdown varnish and/or other additives and solvent to achieve desired physical properties.

Having described the details of the preferred compositions and methods, the following examples will demonstrate the present invention. Unless otherwise specified all percentages are "by weight". In all examples, at least 100 grams of ink composition were prepared.

EXAMPLE 1

A series of experiments was conducted to analyze the effect of cook parameters (temperature and time) on varnish and ink properties in which the varnish contains a water reducible resin and a low molecular weight nonvolatile solvent. In Example 1, the water reducible resin is a short oil alkyd (Cargill 74-7451) and the nonvolatile solvent is a fatty acid, namely oleic acid having a molecular weight of 282.

Varnish was produced by combining the resins and oil components together and heating in a one liter laboratory reactor fitted with a thermocouple and high-speed agitation. The heating mantle was fitted with temperature control to maintain constant temperature.

Once the desired temperature was reached, a stopwatch was used to monitor the cook time. At cook times of 15 minutes, 30 minutes and 120 minutes, 300 gms. of varnish were removed for analysis. When samples were removed, they were crash cooled in an ice bath to simulate rapid cooling.

The acid number of each varnish sample was determined by titration with 0.1M potassium hydroxide in methanol. Phenolphthalein indicator was used to determine the endpoint.

Test inks were produced by adding 18% by weight of Raven 1500 (Columbian Chemical) pigment to the varnish samples. The pigment was ground on a Buhler SDX600 three roll mill.

Ink viscosity (in poise) and yield value were measured with a laray viscometer (Ademel Lhomargy) using four drop times.

Ink tack was measured at 1 minute and 5 minute intervals on a Twig-Albert Model 106 inkometer at 90° F. and 800 RPM.

Set times were determined by the following procedure:
1. A drawdown was produced from the Akira proof press on King James cast coat stock.
2. The proof was immediately cut into strips to yield a large number of wet ink samples.
3. At two minute intervals, a sample strip was placed between two sheets of paper and forced between the rollers of the proof press.
4. The face of the sheet placed against the wet ink film was examined for transfer.
5. Set was determined as the minimum time when little or no ink is transfered to the sheet.

Gloss measurements were made on King James Cast Coat 80 lb. stock. Proofs were produced from a Akira Seisakusho Model R1-2 proof press. The glossmeter used was a BYK Model 4501 microgloss set at 60° incident beam.

The wash times with an aqueous wash solution comprised of 1% by weight sodium hydroxide, 2% by weight nonionic surfactant (Macol 19), 0.1% by weight EDTA and 96.9% by weight deionized water were determined by the following procedure:
1. Eight grams of Iink were placed on the rollers of a Riobi 500K offset press.
2. The press was idled for one minute to evenly distribute the ink to all rollers.
3. Ten milliliters of the wash solution was added to the rollers and the press was idled for thirty seconds to distribute the wash to all rollers.
4. The press wash up blade was engaged to the roller train.
5. A stopwatch was used to measure the time required to completely clean the rollers of all ink, with small additions of roller wash being added until all rollers were completely cleaned.

Varnish Composition

| Component | Source | AN | Melt Temp (°F.) | Wt. % |
|---|---|---|---|---|
| Fumaric Mod. Rosin | (Unirez 8100, Union Camp) | 100.72 | 230 | 6.1% |
| Fumaric Mod. Rosin | (Unirez 8200, Union Camp) | 202.35 | 309 | 6.1% |
| Phenolic Mod. Rosin | (Unirez 9405, Union Camp) | 20.38 | 320 | 9.1% |
| Short Oil Alkyd | (Cargill 74-7451) | 53 | — | 24% |
| Castor Oil | (United Catalyst) | — | — | 20.5% |
| Oleic Acid | (Emersol 214NF Henkel Inc.) | 202 | — | 19.5% |
| Linseed Oil | (00 Reg. Litho, Degen Oil) | — | — | 4.7% |

Theoretical Beginning Acid Number of Varnish was 72.91. The molecular weight of the oleic acid was 282.

Test Results

| Cook Temp (°F.) | Cook Time (Min) | End AN | Vis/ Yield | Tac 1/ Tac 5 | Set (Min.) | Dry Gloss | Wash (Min.) |
|---|---|---|---|---|---|---|---|
| 320 | 15 | 68.10 | 282/8,000 | 20.0/19.0 | 8 | 98.0 | 4:55 |
| 320 | 30 | 62.70 | 310/3,500 | 20.3/19.4 | 11 | 98.90 | 4:30 |
| 320 | 120 | 58.40 | 265/4,000 | 20.2/19.6 | 12 | 94.1 | 10+ |
| 360 | 15 | 66.50 | 245/2,500 | 19.7/19.5 | 10 | 95.90 | |
| 360 | 30 | 61.14 | 260/2,500 | 19.9/19.2 | 15 | 90.00 | 5:20 |
| 360 | 120 | 46.04 | 294/3,000 | 22.4/20.6 | 19 | 88.70 | 10+ |
| 400 | 15 | 62.70 | 220/5,900 | 18.4/19.5 | 15 | 83.50 | 6:40 |
| 400 | 30 | 54.70 | 265/2,000 | 20.2/18.8 | 17 | 86.20 | 6:15 |
| 400 | 120 | 35.54 | 350/2,200 | 24.1/21.3 | 19+ | 90.70 | 10+ |

The printability of all ink samples was good.

EXAMPLE 2

Example 2 comprised a series of experiments, identical to the procedures of example 1 except that the low molecular weight nonvolatile solvent was a fatty acid ester, namely Nirez 9012 from Arizona Chemical. The fatty acid ester had a molecular weight of about 300. The theoretical beginning acid value of the varnish was 34.74.

Varnish Composition

| Component | Source | AN | Melt Temp (°F.) | Wt. % |
|---|---|---|---|---|
| Fumaric Mod. Rosin | (Unirez 8100, Union Camp) | 100.72 | 230 | 6.1% |
| Fumaric Mod. Rosin | (Unirez 8200, Union Camp) | 202.35 | 309 | 6.1% |
| Phenolic Mod. Rosin | (Unirez 9405, Union Camp) | 20.38 | 320 | 9.1% |
| Short Oil Alkyd | (Cargill 74-7451) | 53 | — | 24% |
| Castor Oil | (United Catalyst) | — | — | 20.5% |
| Fatty Acid Ester | (Nirez 9014, Arizona Chem.) | — | — | 19.5% |
| Linseed Oil | (00 Reg. Litho, Degen Oil) | — | — | 4.7% |

Test Results

| Cook Temp (°F.) | Cook Time (Min) | End AN | Vis/ Yield | Tac 1/ Tac 5 | Set (Min.) | Dry Gloss | Wash (Min.) |
|---|---|---|---|---|---|---|---|
| 320 | 15 | 36.45 | 230/11,000 | 15.9/16.5 | 5 | 97.90 | 3:23 |
| 320 | 30 | 33.87 | 240/8,000 | 16.5/17.7 | 8 | 98.90 | 2:44 |
| 320 | 120 | 32.27 | 235/4,000 | 17.6/18.7 | 8 | 97.90 | 3:48 |
| 360 | 15 | 32.69 | 235/3,000 | 17.8/17.7 | 10 | 100.50 | 4:10 |
| 360 | 30 | 32.35 | 255/8,000 | 18.2/19.1 | 10 | 101.30 | 2:54 |
| 360 | 120 | 29.02 | 255/3,000 | 19.5/20.2 | 12 | 95.70 | 4:23 |
| 400 | 15 | 30.93 | 222/4,000 | 18.3/18.5 | 10 | 96.60 | 3:49 |
| 400 | 30 | 29.58 | 255/4,000 | 19.6/19.9 | 8 | 98.40 | 4:00 |
| 400 | 120 | 24.45 | 550/8,000 | 26.5/26.3 | 8 | 90.40 | 10:00+ |

The printability of all ink samples was good.

EXAMPLE 3

In example 3, an ink varnish was produced by the process of the present invention and was then used to flush presscake to produce a color concentrate known as a flush.

An ink varnish having the composition set forth below was produced by cooking all ingredients except the oleic acid and linseed oil in a cook kettle. The oleic acid and linseed oil were held out and maintained at room temperature. The kettle was heated with the caster oil until a temperature of 250 ° F. was reached. The Unirez 8100 was then added and the heating continued with agitation. When the temperature reached 300° F., the alkyd, Unirez 8200 and Unirez 9405 were added with agitation. The temperature was brought to 330 ° F. and held for 15 minutes, after which the oleic acid and linseed oil were added to rapidly drop the temperature to 270° F. Cooling water was then circulated through cooling coils in the kettle to drop the temperature to 200° F.

| Varnish Composition | | | | |
|---|---|---|---|---|
| Component | Source | AN | Melt Temp (°F.) | Wt. % |
| Fumaric Mod. Rosin | (Unirez 8100, Union Camp) | 100.72 | 230 | 5.97% |
| Fumaric Mod. Rosin | (Unirez 8200, Union Camp) | 202.35 | 309 | 5.97% |
| Phenolic Mod. Rosin | (Unirez 9405, Union Camp) | 20.38 | 320 | 8.91% |
| Short Oil Alkyd | (Cargill 74-7451) | 53 | — | 25.66% |
| Castor Oil | (United Catalyst) | — | — | 32.68% |
| Oleic Acid | (Emersol 214NF Henkel Inc.) | 202 | — | 15.60% |
| Linseed Oil | (00 Reg. Litho, Degen Oil) | — | — | 5.21% |

Three pounds of presscake containing approximately 33% pigment in water (Cyan, Sun Chemical 449-1281) was flushed by adding to sigma-blade mixed. Two pounds of the varnish were then added slowly over a one hour period until the flush "broke" and free water was generated. The water was decanted and an additional one pound of varnish was added over an additional one hour period. Mixing continued for an additional hour to decant the remaining water. The result was a color flush containing 24.8% pigment in varnish.

EXAMPLE 4

Because a color flush contains a higher concentration of pigment than is desired for an ink composition, production of an ink composition involves combining the flush with a letdown varnish together with other ink additives and additional solvent, if needed, to obtain an ink composition with the desired pigment concentration, viscosity and other physical properties. Example 4 demonstrates the production of ink compositions of the process colors magenta, cyan and yellow by combining a flush prepared in accordance with the process of example 3 and a letdown varnish of the following composition also prepared in accordance with the process of example 3.

| Varnish Composition | | | | |
|---|---|---|---|---|
| Component | Source | AN | Melt Temp (°F.) | Wt. % |
| Fumaric Mod. Rosin | (Unirez 8100, Union Camp) | 100.72 | 230 | 6.6% |
| Fumaric Mod. Rosin | (Unirez 8200, Union Camp) | 202.35 | 309 | 6.6% |
| Phenolic Mod. Rosin | (Unirez 9405, Union Camp) | 20.38 | 320 | 8.8% |
| Short Oil Alkyd | (Cargill 74-7451) | 53 | — | 24.3% |
| Castor Oil | (United Catalyst) | — | — | 31.0% |
| Fatty Acid Ester | (Nirez 9014, Arizona Chem.) | — | — | 16.1% |
| Linseed Oil | (00 Reg. Litho, Degen Oil) | — | — | 6.6% |

The ink compositions of the process colors magenta, cyan and yellow were as follows:

| Process Magenta | | |
|---|---|---|
| Flush | (Pigment: RD-2005, Uhlich Color) | 73.7% |
| Letdown Varnish | | 12.3% |
| Fatty Acid Ester | (Nirez 9014, Arizona Chemical) | 7.4% |
| Wax | (C-348, Lawter International) | 3.6% |
| Drier | (Co—Mn LinAll 907, OMG Inc.) | 2.0% |
| Trilon BDF | (BASF Inc.) | 1.0% |

| Process Cyan | | |
|---|---|---|
| Flush | (Pigment 449-1281, Sun Chemical) | 60.3% |
| Letdown Varnish | | 28.0% |
| Fatty Acid Ester | Nirez 9014, Arizona Chemical | 5.2% |
| Wax | (C-348, Lawter International) | 3.5% |
| Drier | (Co—Mn LinAll 907, OMG Inc.) | 2.0% |
| Trilon BDF | (BASF Inc.) | 1.0% |

| Process Yellow | | |
|---|---|---|
| Flush | (Pigment 688, Industrial Color) | 74.7% |
| Letdown Varnish | | 7.3% |
| Fatty Acid Ester | (Nirez 9014, Arizona Chemical) | 11.4% |
| Wax | (C-348, Lawter international) | 3.6% |
| Drier | (Co—Mn LinAll 907, OMG Inc.) | 2.0% |
| Trilon BDF | (BASF Inc.) | 1.0% |

PROCESS BLACK

The process black ink composition having the following composition was produced by combining the resins, oils and solvents in accordance with the varnish cook process of Example 3. In such process, 10% of the fatty acid ester was held out and maintained at room temperature. The carbon black, alkali blue, wax and driers were then added and milled on a Buhler SDX600 three roll mill.

| Carbon Black | (Raven 1500, Columbian Chem.) | 15.10% |
|---|---|---|
| Unirez 8100 | (Union Camp) | 4.41% |
| Unirez 8200 | (Union Camp) | 4.41% |
| Unirez 9405 | (Union Camp) | 5.78% |
| Short Oil Alkyd | (74-7451, Cargill Inc.) | 17.62% |
| Modified Linseed Oil | (73-7319, Cargill Inc.) | 3.18% |
| Castor Oil | (USP grade, United Catalyst | 21.14% |
| Linseed Oil | (00-Reg, Litho, Degen Oil) | 3.45% |
| Fatty Acid Ester | Nirez 9014, Arizona Chemical | 16.84% |
| Wax | (C-348, Lawter International) | 3.5% |
| Drier | (Co—Mn LinAll 907, OMG Inc.) | 2.0% |
| Trilon BDF | (BASF Inc.) | 1.0% |
| Alkali Blue | (BASF Inc.) | 1.57% |

The above process color inks were printed on a lithographic Heidelberg Speedmaster 40" six color press. The fountain solution used was Anchor 2832 Emerald 3Z etch and Anchor 2721 ARS-FD at 3 ounces and 4 ounces per gallon respectively. Twenty thousand impressions were run.

The following print characteristics were obtained:

| Ink | Density | Dot Gain (50%, 150 line) | Print Contrast | Gloss (60° C.) |
|---|---|---|---|---|
| Magenta | 1.43 | 25.5% | 34.5 | 65 |
| Cyan | 1.40 | 25.5% | 34.5 | 46 |
| Yellow | 0.93 | 17.0% | 32 | 57 |
| Black | 1.72 | 28.5% | 36 | 58 |

Paper gloss was 36 to 40. Set times and water washability were good for all inks.

EXAMPLE 5

In example 5, the procedure of example I was followed for varnish composition employing a variety of nonvolatile solvents.

Varnish Composition

| Component | Source | AN | Melt Temp (°F.) | Wt. % |
|---|---|---|---|---|
| Fumaric Mod. Rosin | (Unirez 8100, Union Camp) | 100.72 | 230 | 6.1% |
| Fumaric Mod. Rosin | (Unirez 8200, Union Camp) | 202.35 | 309 | 6.1% |
| Phenolic Mod. Rosin | (Unirez 9405, Union Camp) | 20.38 | 320 | 9.1% |
| Short Oil Alkyd | (Cargill 74-7451) | 53 | — | 24% |
| Castor Oil | (United Catalyst) | — | — | 20.5% |
| Linseed Oil | (00 Reg. Litho, Degen Oil) | — | — | 4.7% |
| Nonvolatile Comp. | (See Table Below) | — | — | 19.5% |

Nonvolatile Component

| Sample | Description |
|---|---|
| A | Methyl Laurate (Emery 2296, Henkel) |
| B | Methyl Oleate (Emery 2219, Henkel) |
| C | Acintol Fatty Acid 2 (PC-01-040, Arizona Chemical) |
| D | Caprylic Acid (Emery 657, Henkel) |
| E | Fatty Acid Ester (Nirez 9012, Arizona Chemical) |
| F | Coconut Fatty Acid (Emery 622, Henkel) |
| G | Soya Fatty Acid (Emery 618, Henkel) |

Test Results

| Sample | Cook (°F.) | Cook (Min) | End AN | Vis/ Yield | Tac 1/ Tac 5 | Set (Min.) | Dry Gloss | Wash (Min.) | TAN |
|---|---|---|---|---|---|---|---|---|---|
| A | 320 | 15 | 34.37 | 115/4,000 | 14.3/18.8 | 6 | 95.70 | 3:58 | 33.8 |
| B | 320 | 15 | 32.97 | 179/11,500 | 14.0/15.7 | 6 | 98.10 | 3:43 | 34.2 |
| C | 320 | 15 | 67.7 | 208/6,500 | 18.2/17.5 | 5 | 98.20 | 3:20 | 71.6 |
| D | 320 | 15 | 95.1 | 140/2,500 | 16.3/18.5 | 10 | 92.70 | 3:35 | 108.3 |
| E | 320 | 15 | 32.8 | 325/15.500 | 14.3/16.1 | 7 | 92.70 | 3:12 | 34.16 |
| F | 320 | 15 | 80.7 | 206/45,000 | 16.8/17.3 | 9 | 92.70 | 3:11 | 86.59 |
| G | 320 | 15 | 70.1 | 300/65,000 | 18.5/18/2 | 10 | 93.30 | 5.16 | 72.77 |

We claim:

1. A substantially water insoluble ink varnish comprising a resin component, an oil component and a solvent component wherein said solvent component includes a functional nonvolatile solvent comprising 5% to 75% by weight of the varnish and wherein the acid number of said varnish is greater than 25.

2. The ink varnish of claim 1 wherein the acid number of said varnish is greater than 45.

3. The ink varnish of claim 2 wherein the acid number of said varnish is greater than 60.

4. The ink varnish of claim 1 being a lithographic ink varnish.

5. The ink varnish of claim 1 wherein at least a portion of said resin component comprises a water reducible resin.

6. The ink varnish of claim 1 wherein said nonvolatile solvent has a molecular weight less than 350.

7. The ink varnish of claim 1 wherein said nonvolatile solvent is comprised of one or more of a fatty acid, fatty acid ester, fatty amine and fatty alcohol.

8. The ink varnish of claim 7 being a lithographic ink varnish.

9. An ink composition comprising the varnish of claim 1 and a pigment component.

10. A substantially water insoluble ink varnish comprising a resin component, an oil component and a solvent component wherein said resin component includes a water reducible resin in an amount sufficient to render said varnish substantially water insoluble at acidic pH levels and water washable at alkaline pH levels with sufficient strength to convert said varnish to a water washable form and wherein at least a portion of said solvent component is a nonvolatile solvent.

11. The ink varnish of claim 10 wherein said nonvolatile solvent has a molecular weight less than 350.

12. The ink varnish of claim 10 wherein said nonvolatile solvent is comprised of one or more of a fatty acid, fatty acid ester, fatty amine and fatty alcohol.

13. The ink varnish of claim 10 being a lithographic ink varnish.

14. The ink varnish of claim 13 wherein the acid number of said ink varnish is greater than 25.

15. An ink composition comprising the varnish of claim 10 and a pigment component.

16. A substantially water insoluble ink varnish comprising a resin component, an oil component and a solvent component wherein said solvent component includes a low molecular weight nonvolatile solvent of a molecular weight less than 500 and existing in said varnish in its low molecular weight form, wherein said nonvolatile solvent comprises about 5% to 75% by weight of the varnish.

17. The ink varnish of claim 16 being a lithographic ink varnish.

18. The ink varnish of claim 16 wherein said nonvolatile solvent is comprised of one or more of a fatty acid, fatty acid ester, fatty amine and fatty alcohol.

19. A method of making a substantially water insoluble ink varnish comprising a resin component, an oil component and a solvent component, at least one of said components being a functional component, said method comprised of the steps of:

heating at least a portion of said resin, oil and solvent components to a cook temperature and cooking said portion of said resin, oil and solvent components for a cook time and at temperature no greater than said cook temperature, said cook temperature being sufficiently high and said cook time being sufficiently long for said resin component to be dissolved by said oil and solvent components and said cook temperature being sufficiently low and said cook time being sufficiently short to maintain said functional component substantially in its functional form.

20. The method of claim 19, wherein said functional component is an acid functional component and wherein said cook temperature is sufficiently low and said cook time is sufficiently short to limit the reduction of acid number of the varnish during said heating and cooking steps to no greater than 25%.

21. The method of claim 19 wherein said functional component is a water reducible resin and wherein said cook temperature is sufficiently low and said cook time is sufficiently short to maintain said water reducible resin in its water reducible form during said heating and cooking steps.

22. The method of claim 21 wherein said varnish is a lithographic ink varnish.

23. The method of claim 22 wherein said functional component is an acid functional component.

24. The method of claim 23 wherein the acid number of said varnish is at least 25.

25. The method of claim 21 wherein said solvent component includes a nonvolatile solvent and said functional component further includes at least a portion of said nonvolatile solvent.

26. The method of claim 19 wherein said solvent component includes a nonvolatile solvent and said functional component includes at least a portion of said nonvolatile solvent.

27. The method of claim 26 wherein a portion of said nonvolatile solvent is a low molecular weight nonvolatile solvent having a molecular weight no greater than about 350 and wherein said cook temperature is sufficiently low and said cook time is sufficiently short to maintain at least 70% by weight of said low molecular weight solvent in a form having a molecular weight no greater than 350 during said heating and cooking steps.

28. The method of claim 20 wherein the acid number of said varnish is at least 25.

29. The method of claim 19 wherein said cook temperature is no greater than 20° F. above the melting point of the highest melting point resin component.

30. The method of claim 19 wherein said cook time is no longer than one hour.

31. The method of claim 30 wherein said cook time is no longer than 30 minutes.

32. The method of claim 29 wherein said cook time is no longer than one hour.

33. The method of claim 19 including cooling said portion of said resin, oil and solvent components after said cooking step.

34. The method of claim 33 wherein said cooling step includes combining said portion of said resin, oil and solvent with a second portion of said oil, second portion of said solvent or mixtures thereof being at a temperature less than said cook temperature.

35. The method of claim 19 wherein said resin is a water reducible resin.

36. The method of claim 35 wherein said varnish is a lithographic ink varnish.

37. A method of making an ink composition comprising making the varnish of claim 19 and combining said varnish with a pigment component.

38. A method of making a substantially water insoluble lithographic ink varnish comprising a resin component and a solvent component, at least one of said components being an acid functional component, said method comprised of the steps of:

heating at least a portion of said resin and solvent components to a cook temperature sufficiently high to dissolve said resin component in said solvent component; and cooking said resin and solvent components for a cook time sufficiently short to preclude reduction of the acid number of the varnish during said cook time of no more than 25%.

39. The method of claim 38 wherein the cook time is sufficiently short to preclude reduction of the acid number of the varnish more than 10%.

40. The method of claim 38 wherein the acid number of the varnish after said cook time is greater than 25.

* * * * *